(12) United States Patent
Kricorissian et al.

(10) Patent No.: US 7,483,561 B2
(45) Date of Patent: Jan. 27, 2009

(54) MINIATURIZED IMAGING MODULE CONSTRUCTION TECHNIQUE

(75) Inventors: Gregg R. Kricorissian, Ottawa (CA); Tao Zhang, Ottawa (CA)

(73) Assignee: Psion Teklogix Systems Inc., Mississauga, Ontario (CA)

( * ) Notice: Subject to any disclaimer, the term of this patent is extended or adjusted under 35 U.S.C. 154(b) by 960 days.

(21) Appl. No.: 11/000,256

(22) Filed: Nov. 30, 2004

(65) Prior Publication Data
US 2006/0114347 A1 Jun. 1, 2006

(51) Int. Cl.
*G06K 9/00* (2006.01)
(52) U.S. Cl. ..................................................... 382/147
(58) Field of Classification Search ......... 382/141–149; 348/87, 92, 126
See application file for complete search history.

(56) References Cited

U.S. PATENT DOCUMENTS

| | | | | |
|---|---|---|---|---|
| 4,388,672 | A * | 6/1983 | Skill | 361/803 |
| 6,283,372 | B1 | 9/2001 | Li | |
| 6,607,128 | B1 | 8/2003 | Schwartz et al. | |
| 6,700,448 | B1 | 3/2004 | Knecht | |
| 2002/0180867 | A1 | 12/2002 | Adair et al. | |
| 2003/0089776 | A1 | 5/2003 | Hennick et al. | |
| 2004/0027459 | A1 | 2/2004 | Segawa et al. | |

FOREIGN PATENT DOCUMENTS

| | | |
|---|---|---|
| EP | 0 427 106 A2 | 10/1990 |
| EP | 0 571 749 A1 | 4/1993 |

* cited by examiner

*Primary Examiner*—Daniel G Mariam
(74) *Attorney, Agent, or Firm*—Pearne & Gordon LLP

(57) ABSTRACT

A method of constructing an image reader module and the image reader are described. The image reader module includes two or more circuit boards in a stacked configuration. Corresponding notches for receiving supports are formed along adjacent edges of the boards, which also have electrical contact points at the edges of each board connected to circuits on the boards. The supports are mounted in the notches between the two or more circuit boards to structurally interconnect the boards. Each of the supports, which may be flex cables or conductive bus bars, have one or more electrical conductors that are electrically connected to the contact points on the boards to electrically interconnect the boards, whereby the connections between the electrical conductors and the contact points form test points for the module. The notches may be substantially rectangular to receive the flex cable or may be slots to receive a bus bar. One end of the structural support flex cable or bus bar may be flush with one of the circuit boards and the other end of the structural support may extend past another one of the circuit boards. The supports may be soldered to the edges of the boards within the notches, which may be initially plated. In the image reader module an image sensor may be located on one of the circuit boards and an illumination assembly may be located on another of the circuit boards.

29 Claims, 5 Drawing Sheets

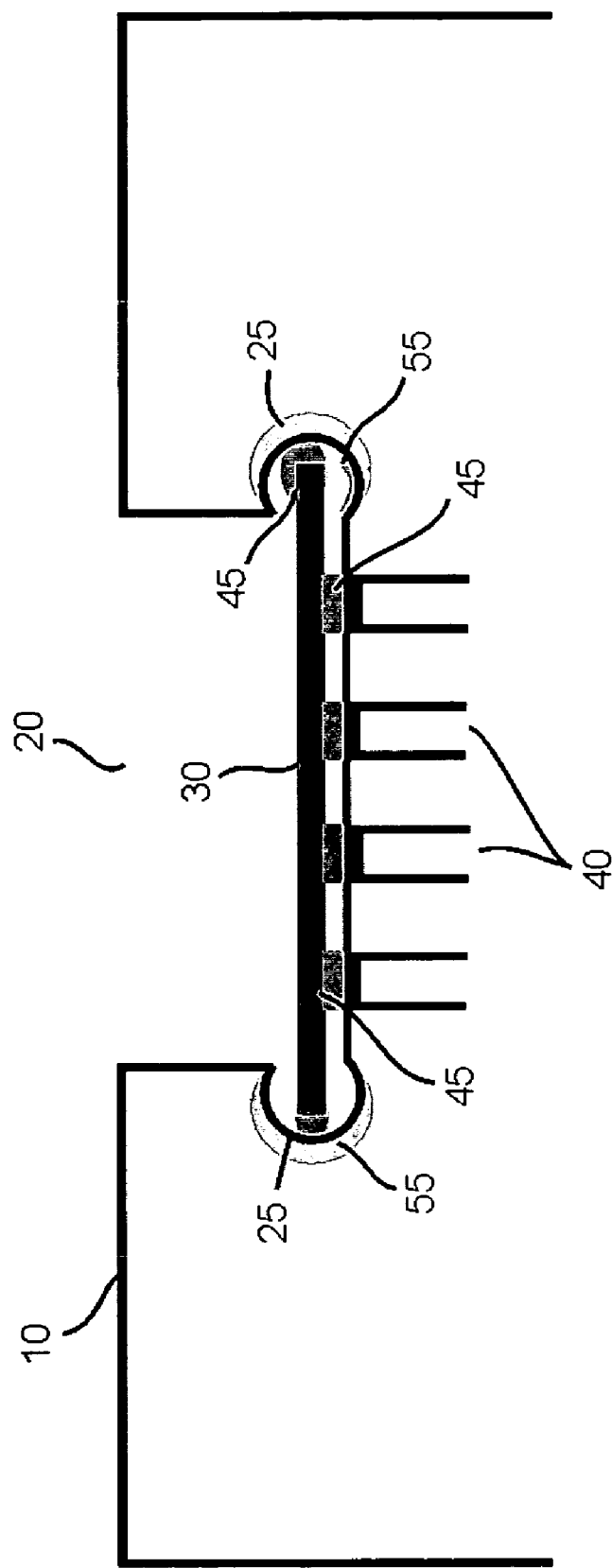

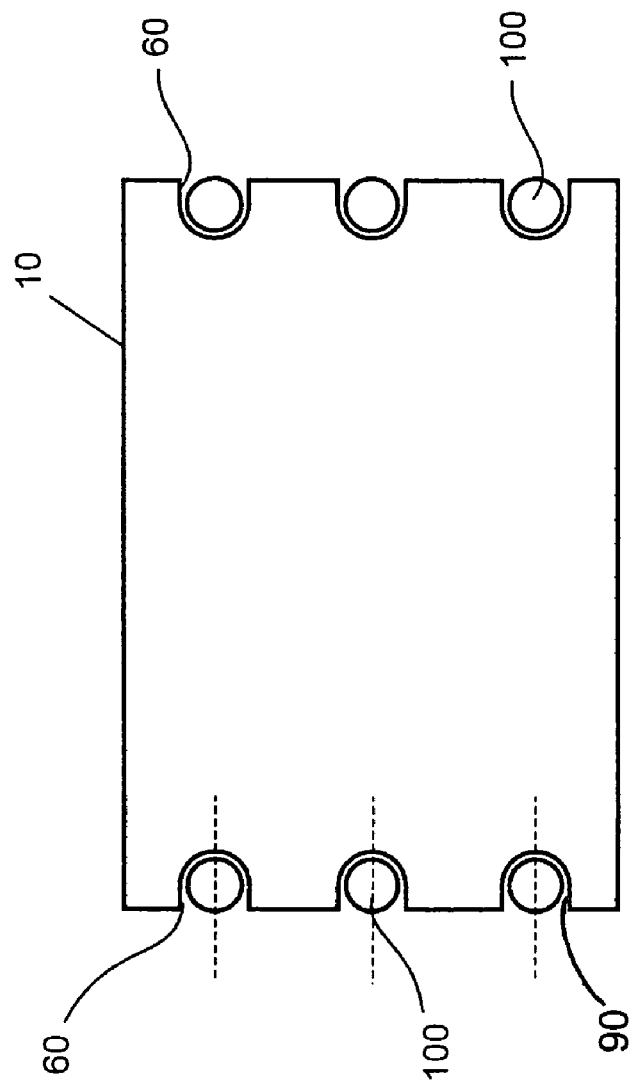
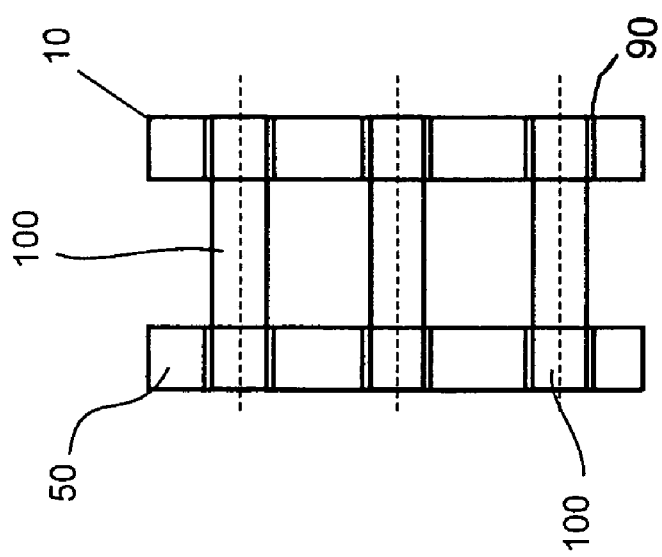

MINIATURIZED IMAGING MODULE CONSTRUCTION TECHNIQUE

FIELD OF INVENTION

The present invention relates generally to miniaturized image reader modules and more specifically to a packaging technique for use in a miniaturized image reader module.

BACKGROUND OF THE INVENTION

There exists a need in the industry for reduced area image reading devices that can be used in industrial application including bar code readers, PDA's and even wireless/cellular picture phones. With the ever-decreasing size of these applications, miniaturization of the image reading module itself is a perennial problem.

Present packaging techniques are often not adequate for the rate of miniaturization currently required in the industry. Another problem with current packaging techniques is a lack of a suitable device testing points, which could be used instead of the device's interconnect ribbons at the verification and calibration stage of the manufacturing process. These ribbons become worn and often need replacing before final shipping.

US Patent Application Publication 2003/0089776 filed on Mar. 7, 2002 by Henick and published on May 15, 2003, discloses a packaging technique for an image reader module, which uses support posts to connect the boards and provide structural integrity. These posts may also be used for electrical connectivity between the boards. The main drawback to this technique however, is that the posts pass directly through apertures within the boards, taking up valuable real estate within the module. Further, this structure does not include test points useful in testing the module at the manufacturing stage.

Another prior art technique for interconnecting circuit boards in a variety of modules, involves the use of connector rods attached to cutout grooves in the boards. The rods are mounted perpendicularly between two boards to form bridges. The rods fit into the cutout grooves and are soldered into place. These rods provide structural integrity as well as electrical connectivity. In a camera module however, the use of this technique to include test pads at the solder joints or test pads that are electrically connected to the solder joints is not disclosed.

There are packaging techniques which use flex cables to connect circuit boards in an image reader module. The flex cables are connected to the outer edges of the boards then folded to make the boards parallel to each other for packaging. The main drawback to this technique is the amount of flex cable that is required, and the wear and tear that is imparted on the cables when they are folded over. Further, the cables do not provide any structural integrity to the boards. The structural support must be provided in other ways such as the housing or support posts. A further disadvantage is the space that the folded cable takes up in the module. With ever decreasing module sizes, this can be a significant drawback.

Therefore there is a need for a packaging technique which allows for the needed level of miniaturization required by the industry, while providing test points electrically connected to the circuit boards useful in the verification and product testing stages of the manufacturing process.

SUMMARY OF THE INVENTION

It is an advantage of the present invention to provide a packaging technique that permits the needed level of miniaturization required by the industry.

It is a further advantage of the present invention to provide a packaging technique that provides test points electrically connected to the circuit board.

The present invention is directed to an image reader module comprising two or more circuit boards in a stacked configuration The boards have corresponding notches along adjacent edges and electrical contact points at the edges of each board connected to circuits on the board. Supports are mounted in the notches between the two or more circuit boards to structurally interconnect the boards. Each of the supports have one or more electrical conductors that are electrically connected to the contact points on the boards to electrically interconnect the boards, whereby the connections between the electrical conductors and the contact points form test points for the module.

In accordance with a further aspect of the invention, the support is a flex cable having ends adapted to fit securely within the notches, which are substantially rectangular, the flex cable may have a width greater then the notches.

In accordance with another aspect of the invention, the notches are substantially in the shape of a slot and the support is a bus bar having ends adapted to fit securely within the slot shaped notches in the circuit boards.

In accordance with a further aspect of the invention, one end of the support flex cable or bus bar is flush with one of the circuit boards and the other end of the support extends past another one of the circuit boards.

In accordance with a specific aspect of the invention, the support is soldered within the corresponding notches of the circuit boards.

The present invention is further directed to a method of constructing an image reader module having two or more circuit boards in a stacked configuration, each board having electrical contact points at the edge of the board surface connected to circuits on the board. The method comprises forming corresponding notches at predetermined locations along adjacent edges of the circuit boards and mounting supports having structural support properties in the corresponding notches between the circuit boards to provide structural support between the boards, wherein the supports are flex cables having electrical conductors or conductive bus bars. Further, the method includes connecting the electrical conductors to the contact points for electrically interconnecting the boards, whereby the connections between the electrical conductors and the contact points form test points.

In accordance with a further aspect of this invention, the method includes cutting lengths of the supports substantially equal to or greater then a desired spacing between the stacked circuit boards.

In accordance with a specific aspect of the invention, the notches may have a substantially rectangular shape to receive a flex cable support or may be a slot to receive a conductive bus bar support.

In accordance with another specific aspect of the invention, the support is soldered to the corresponding notches at the edge of the circuit boards, wherein the edges may be initially plated.

In accordance with another aspect of the invention, the image reader module may have an image sensor on one of the circuit boards and an illumination assembly on another of the circuit boards.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein:

FIG. 1A is a top view of a portion of a circuit board and the connection assembly in accordance with the present invention;

FIGS. 2A and 2B are side and top schematic views of a further embodiment of an image reader module in accordance with the present invention.

DETAILED DESCRIPTION

Packaging is an ongoing problem for miniature image readers, which must fit into increasingly smaller spaces in imaging devices such as bar code readers, PDA's and even wireless/cellular picture phones. These smaller sized components cannot use known packaging technologies such as standard Board-to-Board (BTB) connectors. Successful packaging of an image reader module requires care in interconnecting the circuit boards while maintaining structural stability and electrical connectivity.

Generally, an image reader module is made up of two or more circuit boards including at least an image sensor board and an illumination board. An objective lens usually housed in a barrel is positioned over the sensor board at a fixed distance dependent on the required focal length. The illumination board may be positioned over the image sensor board and may contain an aperture to accommodate the objective lens barrel. Electrical connectivity between boards is usually in the form of a ribbon cable and connectors, or may include posts that run through the boards.

Details of the packaging techniques of the present invention will now be described with reference to the accompanying drawings.

Figure 1B:
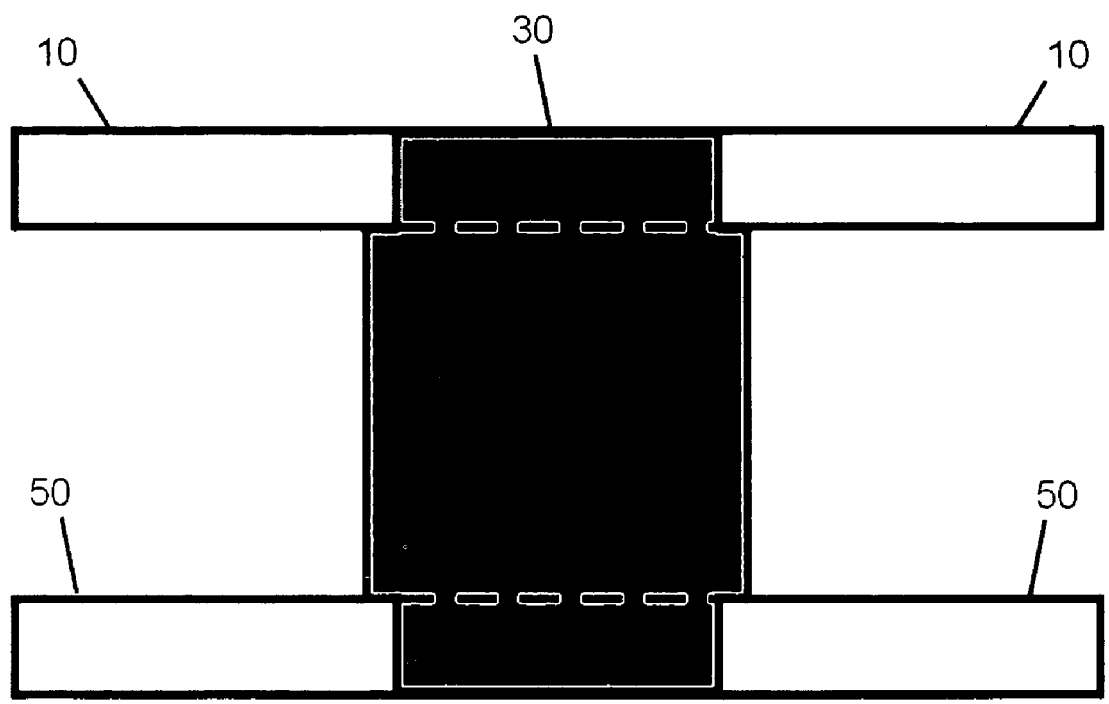
FIG. 1B is a side schematic view of one embodiment of an image reader module in accordance with the present invention.

Referring now to FIGS. 1A and 1B, which illustrate one embodiment of the present invention, corresponding notched spaces 20 are cut out of the adjacent edges of the boards 10, 50, for receiving flex cables 30, which are mounted between the boards 10, 50. The flex cables would be of a type well known in the art, which contain a number of individual conductive paths in the form of conductors separated by insulating material.

The cables 30 are formed into substantially rectangular shapes of a size to fit into the notched spaces 20. In a bar code reader module, these boards include an image sensor board 10 and an illumination board 50 for example. The notches 20 on the edges of the boards 10, 50 may be generally rectangular with a further circular cutout 25 in each corner, though the notches 20 need not be identical. Solder 45 is applied to connect the flex cable 30 to the boards 10, 50 at the contacts 40 such that a conductive path is formed only between the individual cables within the flex cable 30 and the individual contacts 40 on the boards 10, 50.

Those skilled in the art would understand that the flex cable would be fabricated or modified to provide this conductive path between the cable 30 and the contacts 40. This may entail stripping some of the insulating material away to expose the wires. The circular cut-out portion 25 of the notches 20 on the boards may be plated 55 to provide low impedance shielding and structural strength to the cable 30 where soldered in place. The plating 55 may be extended to encompass a portion of the lands on the circuit boards 10, 50.

The flex cables 30 are shaped to fit tightly into the notches 20 at a perpendicular angle such that the cables 30 form bridges between at least two boards 10, 50. When soldered into place, the cable 30 provides electrical connectivity and structural support between the boards 10, 50. Each cable 30 edge is soldered to the boards 10, 50 at the circular cutout portion 25 of the notch 20 on each board 10, 50.

A plurality of electrical contacts 40 located at the notches, may be used to supply power and ground, or other electrical signals, to the boards 10, 50. An application of solder 45 electrically connects the flex cable 30 to the board 10 at the metal plating 55 and subsequently to the electrical contacts 40 with very little impedance. The soldered contacts 40 may also provide the connectivity of the data signals between the cable 30 and the boards 10, 50. Further, the connections between the flex cable 30 conductors and the contacts 40 may form test points or pads for use as access points for product testing and verification at the manufacturing stage.

Figure 1C:
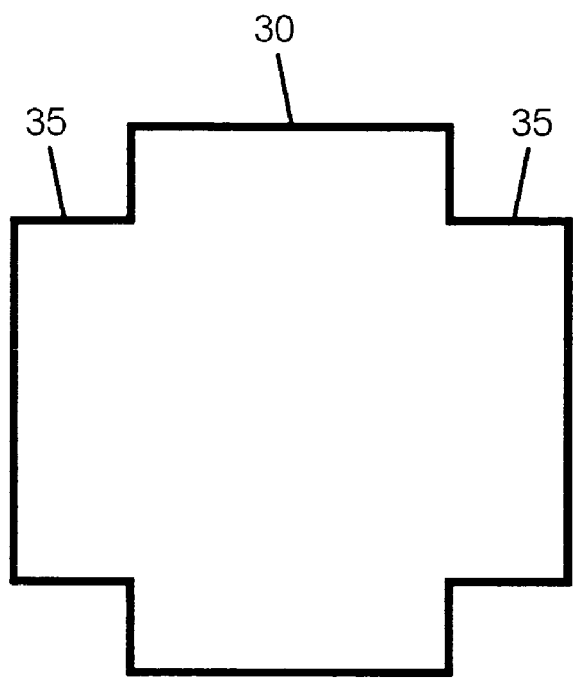
FIG. 1C is a view of a section of flex cable for use with the present invention.

It should be noted by those skilled in the art that different patterns or shapes of the connecting flex cables 30 may be used, and differently shaped notches on the boards 10, 50 may also be used while remaining within the scope of the present invention. For example, as shown in FIG. 1C the corners of the flex cable 30 may be cut out such that the portion of the cable 30 which fits into the notch 20 is narrower than the portion of the flex cable 30 that fits between the boards 10, 50. With this shape of cable 30, the wider portion provides extra structural support to the boards 10, 50 by providing a "shelf" like structure 35, on which the board 10, 50 edges can rest.

Figure 1D:
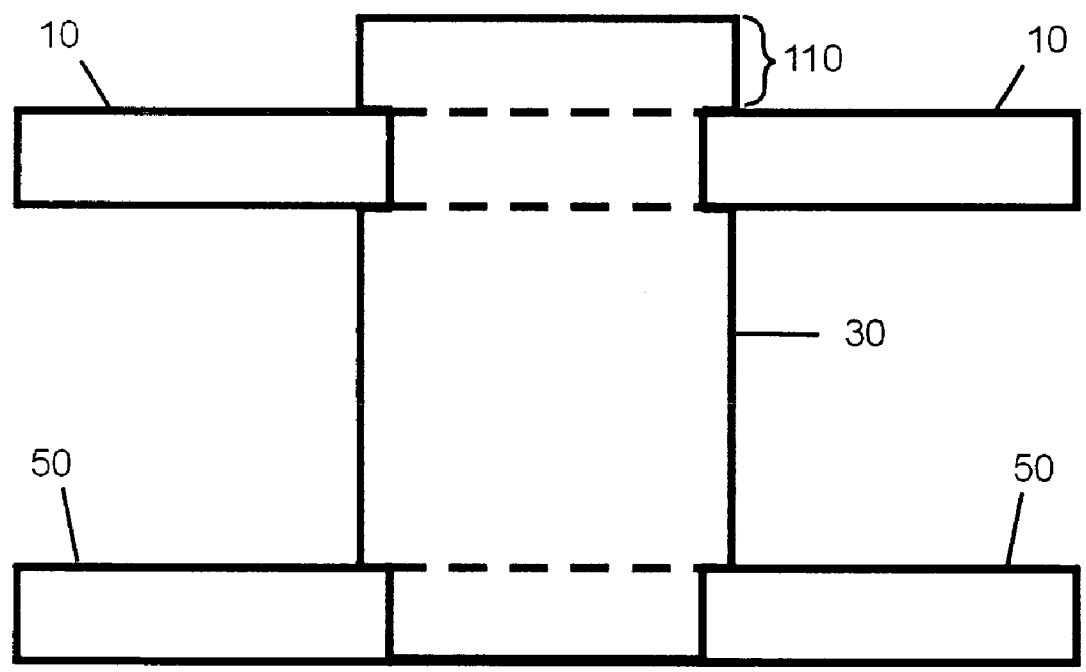
FIG. 1D is a side schematic view of another embodiment of an image reader module in accordance with the present invention.

In another embodiment of the present invention illustrated in FIG. 1D, the flex cable 30, at either the top or bottom edge, may extend slightly past the edge of the board 10 or 50, to form a type of edge connector 110. This edge connector 110 may be used to connect to other modules or to boards such as a companion processor board or it may be used to connect to testing equipment to verify device performance.

In a further embodiment of the present invention shown in FIGS. 2A and 2B, holes are drilled close to the edge of the board 10, and the remaining edge material is cut away to leave notches 60 in the shape of a slot with a rounded end at the edge of the boards 10, 50. Interconnect bus bars 100 fit into the notches 60 at a perpendicular angle to the boards 10, 50. The notches 60 allow the bus bars 100 to remain entirely within the packaging dimensions. The open end of these notches 60 permits easy access for soldering, either manual or automated. The notches 60 may be plated 90 to provide a low impedance connection to the interconnect bus bar 100 when it is soldered in place. Further, the plating 90 of the notch 60 can extend to encompass the entire notch 60 as well as a portion of the lands on the circuit boards 10, 50.

Figure 3:
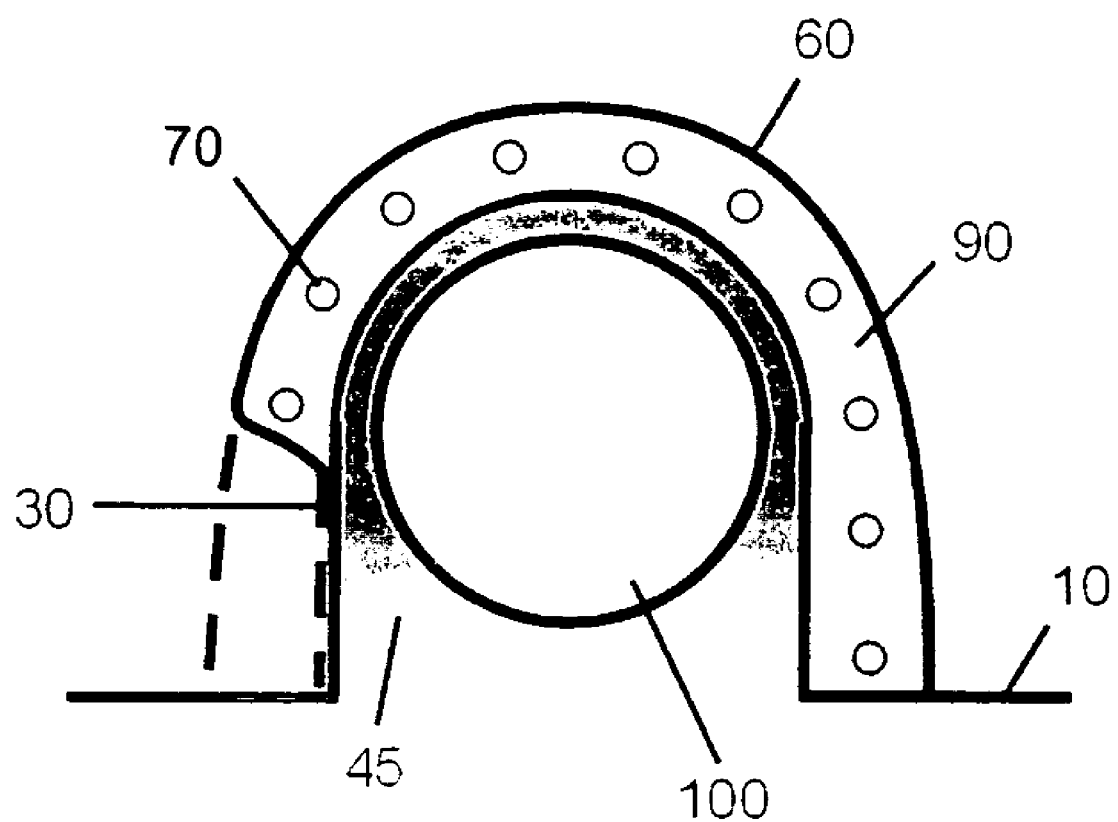
FIG. 3 is a view of the connection between a bus bar and a circuit board.

With reference to FIG. 3, the plating 90 of the notch 60 may be secured to the board 10, 50 for added strength. This is done by forming small holes 70 in board 10, 50. The metal used in the plating 90 process may be heated and applied to the board 10 in molten form. The molten metal seeps into the small holes 70 in the board 10, 50 thereby anchoring the plating 90 to provide extra stability to the plated area 90. The bus bar 100, shown in top view, is seated within the notch 60. Solder 45 connects the bus bar 100 to the board 10 at the metal plating 90 and subsequently to an electrical contact 40 on the board 10, 50 with very little impedance. Further, the connections between the bus bars 100 and the contacts 40 may form test points or pads for use as access points for product testing and verification at the manufacturing stage.

The resulting wire frame provides structural support for the module as well as electrical connectivity between the boards 10, 50. Any number of electrical connections can be made between boards 10, 50 with this technique. It should be noted that various patterns of bus bar 100 interconnections and different quantities of bus bars 100 could also be used to increase structural strength without departing from the scope of the present invention.

As is clear from the above, the present invention has the advantage that it provides a packaging technique that integrates smaller components and boards in an image reader module so as to enable the module to fit into a compact housing and at the same time, it provides for a device having mechanical support as well as electrical connectivity between the image sensor board and the illumination board.

The testing points described in the above embodiments may be used to test and calibrate the device during the manufacturing stage, such that test probes or connectors, either hand held or fixed, may be used instead of the normally fragile interconnection ribbons, which become worn very quickly. This wear can include damage to the delicate interconnect contacts or to the ribbon cable itself which is quite thin and may break easily if folded or bent excessively. Further, worn contacts can cause short circuits in the connector that can then damage electronic circuitry. Once the ribbons are worn, they must be replaced with a new ribbon, which, depending on the extent of the testing, may also need replacing before the product is ready for shipping. With the use of the testing points, the ribbons need only be connected at the final stage of the module assembly.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. An image reader module comprising:
two or more circuit boards in a stacked configuration, the circuit boards having corresponding notches along adjacent edges and electrical contact points at the edge of the board surfaces connected to circuits on the board;
structural supports mounted in the corresponding notches between the circuit boards to provide structural support between the boards, each of the supports having one or more electrical conductors, the electrical conductors being electrically connected to the contact points on the boards for electrically interconnecting the boards, whereby the connection between the electrical conductor and the contact point forms a test point useful in testing the module at the manufacturing stage.

2. The image reader module of claim 1 wherein one of the circuit boards houses an image sensor.

3. The image reader module of claim 2 wherein another of the circuit boards houses an illumination assembly.

4. The image reader module of claim 1 wherein the notches are substantially rectangular.

5. The image reader module of claim 4 wherein the support is a flex cable having ends arranged to fit securely within the notches in the circuit boards.

6. The image reader module of claim 4 wherein the support is a flex cable having a width greater then the notches and with ends adapted to fit securely within the notches in the circuit boards.

7. The image reader module of claim 4 wherein the support is a flex cable arranged to fit securely within the corresponding notches in the circuit boards, with one end of the cable being flush with one of the circuit boards and the other end of the cable extending past another one of the circuit boards.

8. The image reader module of claim 5 wherein the flex cable is soldered within the corresponding notches of the circuit boards.

9. The image reader module of claim 6 wherein the flex cable is soldered within the corresponding notches of the circuit boards.

10. The image reader module of claim 7 wherein the flex cable is soldered within the corresponding notches of the circuit boards.

11. The image reader module of claim 1 wherein the notches are substantially in the shape of a slot.

12. The image reader module of claim 11 wherein the support is a bus bar having ends arranged to fit securely within the notches in the circuit boards.

13. The image reader module of claim 11 wherein the support is a bus bar arranged to fit securely within the notches in the circuit boards, with one end of the bus bar being flush with one of the circuit boards and the other end of the bus bar extending past another one of the circuit boards.

14. The image reader module of claim 12 wherein the bus bar is soldered within the corresponding notches of the circuit boards.

15. The image reader module of claim 13 wherein the bus bar is soldered within the corresponding notches of the circuit boards.

16. A method of constructing an image reader module having two or more circuit boards in a stacked configuration, each board having electrical contact points at the edge of the board surface connected to circuits on the board, comprising:
forming corresponding notches at predetermined locations along adjacent edges of the circuit boards;
mounting flex cables having electrical conductors and structural support properties in the corresponding notches between the circuit boards to provide structural support between the boards; and
connecting the electrical conductors to the contact points for electrically interconnecting the boards, whereby the connections between the electrical conductors and the contact points form test points useful in testing the module at the manufacturing stage.

17. A method as claimed in claim 16 comprising:
cutting lengths of flex cable substantially equal to a desired spacing between the stacked circuit boards.

18. A method as claimed in claim 16 comprising:
cutting lengths of flex cable greater then a desired spacing between the stacked circuit boards.

19. A method as claimed in claim 16 wherein circuit board notching includes cutting the notches in a substantially rectangular shape.

20. A method as claimed in claim 16 comprising:
soldering the flex cable to the edge of each circuit board in the notch.

21. A method as claimed in claim 20 comprising:
plating the edge of the circuit board within the notches.

22. A method as claimed in claim 16 comprising:
    soldering the flex cable conductors to the circuit board contacts.
23. A method of constructing an image reader module having two or more circuit boards in a stacked configuration, each board having electrical contact points at the edge of the board surface connected to circuits on the board, comprising:
    forming corresponding notches at predetermined locations along adjacent edges of the circuit boards;
    mounting conductive bus bars having structural support properties in the corresponding notches between the circuit boards to provide structural support between the boards; and
    connecting the bus bars to the contact points to electrically interconnect the boards, whereby the connections between the bus bars and the contact points form test points useful in testing the module at the manufacturing stage.
24. A method as claimed in claim 23 comprising:
    cutting lengths of bus bar substantially equal to a desired spacing between the circuit boards.
25. A method as claimed in claim 23 comprising:
    cutting lengths of bus bar greater then a desired spacing between the circuit boards.
26. A method as claimed in claim 23 wherein circuit board notching includes:
    cutting the notches as a slot with a rounded end.
27. A method as claimed in claim 26 comprising:
    soldering the bus bar to the edge of each circuit board within the slot.
28. A method as claimed in claim 27 comprising:
    plating the edge of the circuit board within the slot.
29. A method as claimed in claim 23 comprising:
    soldering the bus bars to the circuit board contacts.

* * * * *